US010048312B1

(12) United States Patent
Hoffmeyer et al.

(10) Patent No.: US 10,048,312 B1
(45) Date of Patent: Aug. 14, 2018

(54) TESTING PRINTED CIRCUIT BOARD ASSEMBLY

(71) Applicant: International Business Machines Corporation, Armonk, NY (US)

(72) Inventors: Mark K. Hoffmeyer, Rochester, MN (US); Stephen M. Hugo, Stewartville, MN (US); Mark J. Jeanson, Rochester, MN (US); Matthew S. Kelly, Oakville (CA)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/715,238

(22) Filed: Sep. 26, 2017

Related U.S. Application Data

(63) Continuation of application No. 15/593,811, filed on May 12, 2017.

(51) Int. Cl.
*G01R 31/10* (2006.01)
*G01R 31/28* (2006.01)

(52) U.S. Cl.
CPC .............................. *G01R 31/2817* (2013.01)

(58) Field of Classification Search
CPC ............ G01R 31/2849; G01R 31/2817; G01R 31/2875; G01R 31/2812; G01R 31/2815; G01R 31/2868; G01R 31/2834
See application file for complete search history.

(56) References Cited

U.S. PATENT DOCUMENTS

| | | | |
|---|---|---|---|
| 5,701,667 A | 12/1997 | Birch et al. | |
| 6,873,927 B2 | 3/2005 | Chi et al. | |
| 6,914,424 B2 | 7/2005 | Chi et al. | |
| 9,329,227 B2 | 5/2016 | Xie et al. | |
| 9,658,280 B2 | 5/2017 | Munson et al. | |
| 2005/0261854 A1 | 11/2005 | Adams et al. | |
| 2008/0231299 A1 | 9/2008 | Adams et al. | |

(Continued)

FOREIGN PATENT DOCUMENTS

| EP | 402499 A1 | 12/1990 |
|---|---|---|
| WO | 03096158 A2 | 11/2003 |
| WO | 2014105243 A1 | 7/2014 |

OTHER PUBLICATIONS

Pang et al., "Flip Chip on Board Solder Joint Reliability Analysis Using 2-D and 3-D FEA Models", IEEE Tranactions on Advanced Packaging, vol. 24, No. 4, Nov. 2001, Manuscript received May 1, 2001 ; revised Aug. 14, 2001, Publisher Item Identifier S 1521-3323(01)09355-8, 1523-3323/01 © 2001 IEEE, pp. 499-506.

(Continued)

*Primary Examiner* — Minh N Tang
(74) *Attorney, Agent, or Firm* — Monchai Chuaychoo (57) ABSTRACT

Embodiments of the present invention provide methods for destructive testing of a printed circuit board assembly (PCBA). The PCBA contains embedded components on a printed circuit board within a non-functional area. At least one of these embedded components is susceptible to defects and exposed to conditions that facilitate destructive testing which leads to accelerated measurements. The accelerated measurements on the non-functional area are more representative of variability than measurements on a functional module while providing insights into potential future defects.

1 Claim, 7 Drawing Sheets

(56) References Cited

U.S. PATENT DOCUMENTS

2010/0207651 A1    8/2010  Suto
2012/0119767 A1    5/2012  Su
2017/0192051 A1*  7/2017  Hugo ................. G01R 31/2817

OTHER PUBLICATIONS

Appendix P—List of IBM Patents or Patent Applications Treated as Related, Filed herewith, 2 Pages.

* cited by examiner

TESTING PRINTED CIRCUIT BOARD ASSEMBLY

BACKGROUND

The present invention relates generally to the field of manufacturing technology, and more particularly to reliability testing of power package materials.

Printed circuit boards (PCBs) may be exposed to extreme environment (e.g., high temperatures). A conformal coating is a thin polymeric film applied on the surface of PCBs, wherein the conformal coating prevents corrosion, leakage currents, and electric shorting due to condensation. Assembled PCBs (PCBAs) contain embedded electronic components (e.g., capacitors, and resistors) which are typically soldered onto a surface of the PCB. PCB mechanically supports and electrically connects electronic components using conductive tracks, pads, and other features which are etched from copper sheets laminated onto a non-conductive substrate. PCBs may be single sided (e.g., one copper layer), double sided (e.g., two copper layers), or multi-layered (e.g., outer and inner layers).

PCBs are designed via layout software. The designing process takes into account: (i) the schematic capture (i.e., circuit design); (ii) the card dimensions and template based on the required circuitry and properties of the PCB; (iii) the positions of the electronic components and heat sinks to be embedded on the PCB or attached to the PCB; (iv) the layer stacks (e.g., ground and power planes within the PCB); (v) the line impedance matching (i.e., the maximization of electric power transfer/minimization of signal reflection from an electric lead) based on dielectric layer thickness, routing copper thickness, and trace-width; (vi) the placement of electronic components based on thermal and geometric considerations; (vii) the routing of signal traces; and (viii) the generated Gerber files for manufacturing. The manufacturing of PCBAs involves many steps such as: inputting Gerber files into Computer Aided Manufacturing (CAM) software; panelization (e.g., grouping PCBs for manufacturing onto a panel); copper patterning (e.g., subtractive, additive, and semi-additive processes); chemical etching (e.g., removing materials to create an object with the desired shape via etching chemicals); automated optical inspection (e.g., scanning the PCB and comparing the scanned PCB with the digital image deriving from the Gerber files); laminating materials to yield trace layers inside a PCB; drilling holes through a PCB; plating PCBs with solder, tin, or gold over nickel as a resist for etching away the unneeded underlying copper; coating PCBs with solder or some other anti-corrosion coating; applying solder resists on select areas of the PCBs; printing a legend on one or both sides of PCBs; and populating the PCB with electronic components in order to yield the PCBA. Assembly and component defects may occur during the production of PCBAs.

SUMMARY

According to one embodiment of the present invention, a method is provided. The method comprises: integrating a printed circuit board assembly (PCBA) and a computing device, wherein the PCBA contains a plurality of functional areas and a plurality of non-functional areas on a printed circuit board (PCB); stressing a non-functional area of the plurality of non-functional areas of the PCBA that is susceptible to defects, wherein the non-functional area contains an embedded component susceptible to defect; applying destructive testing to failure of the embedded component susceptible to defect; and responsive to applying the destructive testing, deriving information from the applied destructive testing.

DETAILED DESCRIPTION

By virtue of PCBAs being incorporated into other devices (e.g., products sold in the market place), these defects may result in latent field defects and product reliability problems. Thus, PCBAs need to be tested in order to determine if defects are present. Subsequent to populating the PCB with electronic components, the PCBA can be tested using automated optical inspection, analog signature analysis (e.g., power-off testing), in-circuit testing (e.g., performing physical measurements while the power is on such as voltage), and functional testing. For example, subsequent machine operation, temperature variations due to power cycling, and variability could cause degradation/deterioration the PCBA (e.g., solder joint cracks) due to the forces brought to bear by differences in material coefficients of thermal expansion. Components which fail in a PCB or PCBA are typically composed of soldered connections, laminates, copper-clad laminates, resin impregnated B-stage cloth, and/or copper foil. These defect modes are often characterized in a lab setting on a small sample of production builds that are destructively tested. This destructive testing is costly. Furthermore, the smaller sample sizes used for destructive testing may not be indicative of products manufactured through the life of the product or during the manufacturing of the product (i.e., non-representative results may be obtained). This disclosure remedies these issues and improves the art by the following functions: (i) performing an accelerated destructive testing to failure in a small non-functional area of each PCBA which is accomplished by connecting an apparatus to the non-functional area; and (ii) sending data from the destructive testing to a computer. In turn, these functions characterize the entire PCB of the PCBA and like electronic components that are not destroyed used for client operations. During the production of each PCB and corresponding PCBA, and during use in the field, accelerated destructive testing is applied to fail in a non-functional area of the PCB. Real time measurements and accelerated measurements of each PCB may occur and thus, the testing of certain areas of the PCB is accelerated beyond the normal functional areas. These measurements provide insight into potential failures and replicates the structure of the functional areas of the PCB.

Figure 1A:
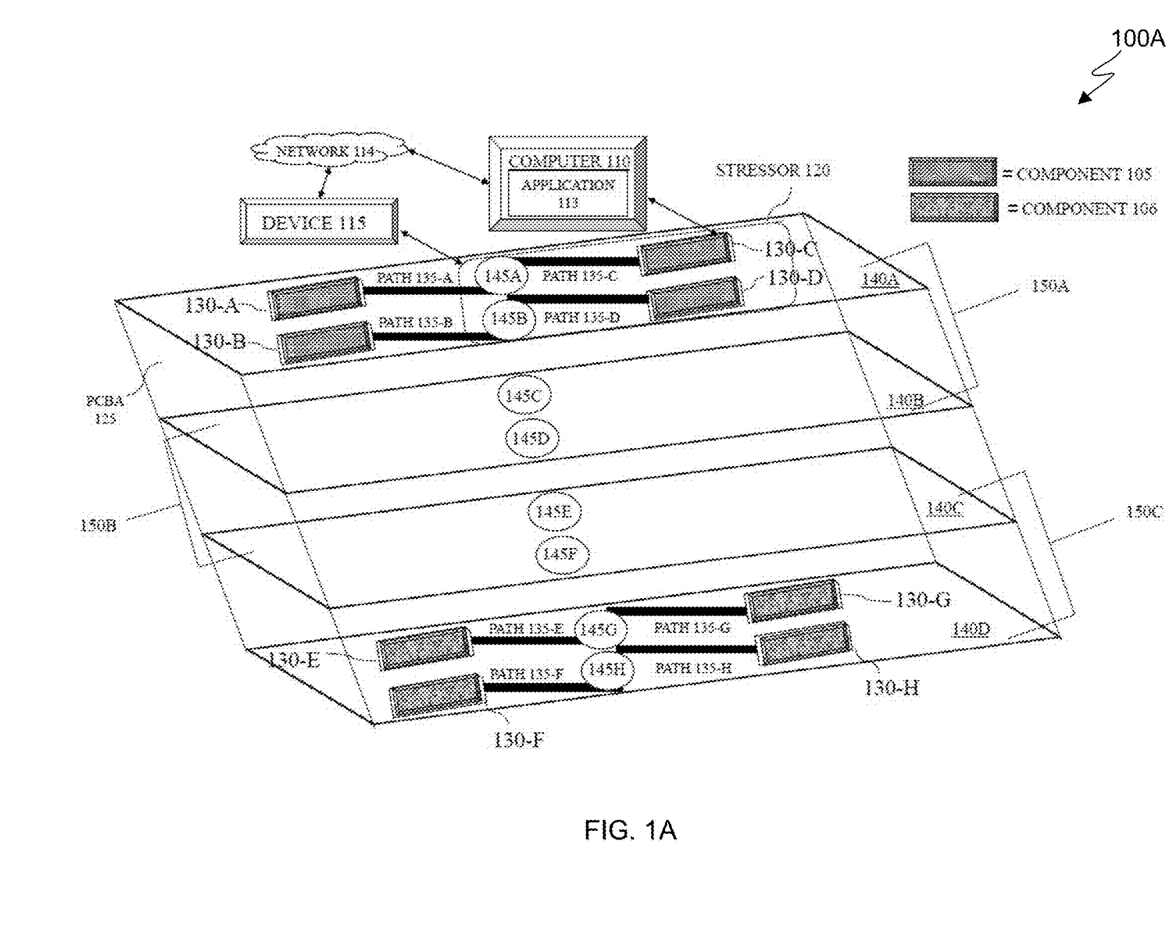
FIG. 1A is a diagram illustrating a data processing environment, in accordance with an embodiment of the present invention.

The present invention will now be described in detail by referencing the Figures. FIG. 1A is a diagram illustrating a data processing environment, generally designated 100A, in accordance with one embodiment of the present invention. FIG. 1A provides only an illustration of implementation and does not imply any limitations regarding the environments in which different embodiments may be implemented. Modifications to data processing environment 100A may be made by those skilled in the art without departing from the scope of the invention as recited by the claims. In this exemplary embodiment, data processing environment 100A includes a PCBA 125, device 115, computer 110, and stressor 120 all interconnected by network 114.

Network 114 can be, for example, a local area network (LAN), a wide area network (WAN) such as the Internet, or a combination of the two, and can include wired, wireless, or fiber optic connections. In general, network 114 can be any combination of connections and protocols that will support communication between PCBA 125, device 115, computer 110, and stressor 120.

The notation of "pad 130-A" through "pad 130-H" is used to differentiate different units of pad 130, wherein pad 130 represents a pad (e.g., a copper surface which has electronic components soldered onto the copper surface).

The notation of "via 145A" through "via 145H" is used to differentiate different units of via 145, wherein via 145 represents a via (i.e., a plated hole) which connects two different layers within a PCB or PCBA and facilitates conduction within a PCB/PCBA. A PCBA is a system which has embedded electronic components on the surface of the PCB.

The notation of "path 135-A" through "path 135-H" is used to differentiate different units of path 135, wherein path 135 are conductive tracks that connect two or more pads (e.g., pad 130); two or more vias (e.g., via 145); and at least one pad (e.g., pad 130) and at least one via (e.g., via 145). Varying the width of path 135 controls the amount electric current transferred to pads and vias.

Pad 130-A through pad 130-H are copper surfaces in a printed circuit board (PCB) on which a component, such as component 105 or component 106, can be soldered on. Component 105 and component 106 may be a resistor, transistor, capacitor, or other electronic components that are compatible with printed circuit board technology. Component 105 and component 106 may be: (i) mounted or placed directly onto the surface of a printed circuit board (e.g., surface 140A) via surface-mount technology or (ii) by inserting leads of component 105 or component 106 into holes drilled onto the surface of a printed circuit board and soldered to pad 130. In an exemplary embodiment, component 105 is soldered on surface 140A while component 106 is soldered onto surface 140D. Units of component 106, as soldered onto surface 140D, are not contained within a non-functional area while units of component 105, as soldered onto surface 140A, are contained with a non-functional area.

PCBA 125 is an example of a multi-layered printed circuit board assembly, wherein multiple units of component 105 are embedded onto the surface of the PCBA 125. There are three layers in PCBA 125—layer 150A, layer 150B, and layer 150C. The surfaces of layer 150A, layer 150B, and layer 150C may be also referred to as planes. In an exemplary embodiment, a single unit of component 105 has been soldered onto pads 130-A, 130-B, 130-C, and 130-D for a total of four units of component 105 embedded on surface 140A. Surface 140A contains a non-functional pad contained within stressor 120, wherein stressor 120 is connected to device 115 and a unit of component 105 soldered into pad 130-C. The unit of component 105 soldered into pad 130-C is connected to computer 110. While not connected to computer 110, another unit of component 105 is soldered into pad 130-D and contained within stressor 120. In an exemplary embodiment, the non-functional pads, as contained within stressor 120, have a soldered unit of component 105 that has been deemed to be the biggest contributor to early life solder cracks (i.e., deterioration of components) due to thermally induced coefficient of thermal expansion (CTE) mismatch characteristics. Furthermore, sensing circuitry is contained within the soldered unit of component 105 that has been deemed to be the biggest contributor to solder cracks in order to obtain data/information relevant for detecting a solder crack failure mechanism.

The top surface of layer 150A is surface 140A, wherein surface 140A also contains a unit of component 105 soldered onto pad 130-C; another unit of component 105 soldered onto pad 130-D; path 135-A connects pad 130-A to via 145A; path 135-B connects pad 130-B to via 145B; path 135-C connects pad 130-C to via 145A; and path 135-D connects pad 130-D to via 145B. The top surface of layer 150B is surface 140B, wherein surface 140B does not contain soldered units of component 105, units of path 135, or units of pad 130. However, surface 140B contains via 145C and via 145D. In various embodiments, the top surface of layer 150C is surface 140C does not contain soldered units of 105, units of paths 135, or units of pad 130. However, surface 140C contains via 145E and via 145F. In an exemplary embodiment, the bottom surface of layer 150D is surface 140D, wherein surface 140D contains soldered units of component 106 in pad 130-E, pad 130-F, pad 130-G, and pad 130-H. Furthermore, surface 140D contains: path 135-E which connects pad 130-E to via 145G; path 135-F which connects pad 130-F to via 145H; path 135-G which connects pad 130-G to via 145G; and path 135-H which connects pad 130-H to via 145H. A single layer within the multiple layers of PCBA 125 may be nonconductive (e.g., silkscreen layer and soldermask layers) or conductive (e.g., isolated voltage supply or ground layer). In other embodiments, a different number of layers may be incorporated into PCBA 125 without departing from the scope of the invention as recited in the claims. In this exemplary embodiment, surface 140A and surface 140D are equally populated/de-populated with components, while compatible with stressor 120 in order to conduct destructive testing of non-functional pads. In another exemplary embodiment, surface 140A and surface 140D are not equally populated/de-populated with components while compatible with stressor 120 in order to conductive destructive testing of non-functional pads.

Via 145A is directly above via 145C, wherein via 145C is directly above via 145E, and wherein via 145E is directly above via 145G. Via 145B is directly above via 145D, wherein via 145D is directly above via 145F, and wherein via 145F is directly above via 145H. Pad 130-A is directly above pad 130-E. Pad 130-B is directly above pad 130-F. Pad 130-C is directly above pad 130-G. Pad 130-D is directly above pad 130-H. Path 135-A is directly above path 135-E. Path 135-B is directly above path 135-F. Path 135-C is directly above path 135-G. Path 135-D is directly above path 135-H.

In various embodiments, stressor 120 is an apparatus which simulates voltage, temperature, and frequency cycling. In some embodiments, stressor 120 can be directly connected to device 115. Device 115 may be an additional device or setup which is able to control the amount of voltage, temperature, and frequency cycling applied onto a non-functional area of PCBA 125. By controlling the amount of voltage, temperature, and frequency cycling, stressor 120 is able to perturb the non-functional pad of PCBA 125 to destructive fail in an accelerated manner. Isolated voltage and ground layers of PCBA 125 aid in simulating voltage regulation. This serves as a controller feature. In an exemplary embodiment, device 115 is a Josephson junction (JJ)-type device which produces a super current (i.e., a current that flows indefinitely long without applying any voltage). For example, device 115 cycles the power on stressor 120 in an accelerated manner in order to facilitate the destructive fail of a unit of component 105 soldered onto pad 130-C, wherein device 115 is a JJ-type device. In another embodiment, device 115 is a cooling device which is able to expose the non-functional pad within stressor 120 to extreme cold temperatures.

Where the setup as depicted in FIG. 1A is not used, in various embodiments, 18000 mini-cycles can be used to facilitate the destructive fail of a unit of component 105 soldered onto pad 130-C. Where the setup as depicted in FIG. 1A is used, 2000 to 4000 mini-cycles are required to facilitate the destructive fail of a unit of component 105 soldered onto pad 130-C. Fewer mini-cycles (e.g., 2000 mini-cycles as opposed to 18000 mini-cycles) proves to be less costly as less electric energy and resources are consumed in order to ascertain the strength and reliability of the solder joint strength of the unit of component 105 soldered onto pad 130-C. Furthermore, this type of destructive testing to fail of a non-functional area is more representative of failed components embedded onto PCBA 125 as opposed to testing a functional area. Suspect components (e.g., units of component 105), which are prone to performance defects and interact with the functional module frequently, pass quality control tests due to the interactions with the functional area despite the suspect component exhibiting poor performance parameters (e.g., weak solder joint strength or degradation to mild conditions). These type of interactions with the suspect component do not necessarily improve the quality of the suspect component. Instead, these type of interactions influence the quality control testing process and skews the result towards passing despite the performance issues exhibited by the suspect component. By utilizing stressor 120-type setup on a non-functional area of PCBA 125 for destructive testing, quality assurance testing would be more representative of PCBA 125 by accounting for the poor performance of the suspect component.

In various embodiments, application 113 is an application that the user (through a graphic user interface) runs on computer 110. Application 113 can behave as a computer program designed to perform a group of coordinated functions, tasks, or activities for the benefit of the user. Some of these functions, tasks, or activities include: controlling/interfacing with device 115 (e.g., modifying the settings that subsequently control stressor 120 in order to perform an accelerated thermal cycle (ATC)); applying destructive testing of a non-functional pad within PCBA 125 using stressor 120 and device 115; monitoring changes in properties of component 105 soldered onto pad 130-C (e.g., monitoring CTE of PCBA 125 in real-time); obtaining information (i.e., data) which corresponds to the changes in the properties of component 105 soldered onto pad 130-C; storing the obtained information into a database (or repository-type structure); and sending the obtained information to graphical user interface or outputting the obtained information to a monitor. In an exemplary embodiment, stressor 120 is instructed by application 113 to apply destructive testing cycle on a component contained within a non-functional pad/area until the component or stressor 120 fails. For example, the component (e.g., a unit of component 105 soldered onto pad 130-C) that fails typically experiences solder cracks at 500 forced temperature cycles. By applying application 113, stressor 120, and device 115 in conjunction with each other, 250 forced temperature cycles lead to solder cracks as opposed to the typical 500 forced temperature cycles when application 113, stressor 120, and device 115 do not work in conjunction with each other. In other words, in various embodiments, the combination of application 113, stressor 120, and device 115 work in unison with each other in order to modulate (i.e., control) the accelerated stressor conditions that are applied on non-functional areas. By modulating the accelerated stressor conditions, some of the components (e.g., a unit of component 105) within the non-functional area reach the point of failure at an accelerated pace. By virtue of: (i) modulating the accelerated stressor conditions and (ii) reaching failure at the accelerated pace, application 113 is able to detect/observe the data and the data trends which correspond to the accelerated destructive testing to failure of the component. These components, which experience the accelerated destructive testing to failure in response to the applied accelerated stressor conditions within the non-functional area, are indicative of potential future defects in a product. Detected/observed data and data trends, as obtained by application 113, may further aid in the description/understanding of what the potential future defects may be (e.g., metal surfaces of solder joints which are prone to overheating that melt plastic surfaces) and/or the variables which effect the defects (e.g., temperature or voltages). The range of cycles, in which stressor 120 and component 105 soldered onto pad 130-C fail, is reflective of an expected field life of PCBA 125. In various embodiments, the connection of stressor 120 to device 115 and the connection of the unit of component 105 soldered onto pad 130-C to application 113 represents a call home feature. The call home feature is able to send obtained information to a database in order to gather and analyze field reliability metrics. The database, which is not depicted in FIG. 1A, resides in computer 110. Application 113 utilizes a programmable setup in which destructive testing is applied on a non-functional pad contained within stressor 120 while running parallel tests and obtaining information during voltage, temperature, and frequency cycling. In an exemplary embodiment, upon applying the destructive testing to fail on the non-functional pad contained within stressor 120, application 113 obtains temperature difference data to calculate the acceleration factor of the Coffin-Manson equation. The degradation of the non-functional pad contained within stressor 120 until fail may be monitored in real time while obtaining data which corresponds to degradation events. For example, application 113 is connected to stressor 120, wherein stressor 120 is connected to device 115. Stressor 120 and device 115 work in unison to increase the voltage applied to component 105 soldered onto pad 130-C and component 105 soldered onto pad 130-D over a period time. The voltage is applied until the soldered components within stressor 120 fail. The setup as depicted in FIG. 1A allow an end-user to observe the initial onset of component degradation upon increasing voltages.

Computer 110 houses application 113, graphical user interface (GUI), and a database, wherein application 113, the GUI, and the database are connected to each other. Computer 110 may be a laptop computer, a tablet computer, a netbook computer, a personal computer (PC), a desktop computer, a personal digital assistant (PDA), a smart phone, a thin client, or any programmable electronic device capable of communicating with stressor 120 and device 115 via network 114. Computer 110 may include internal and external hardware components, as depicted and described in further detail with respect to FIG. 4.

Figure 1B:
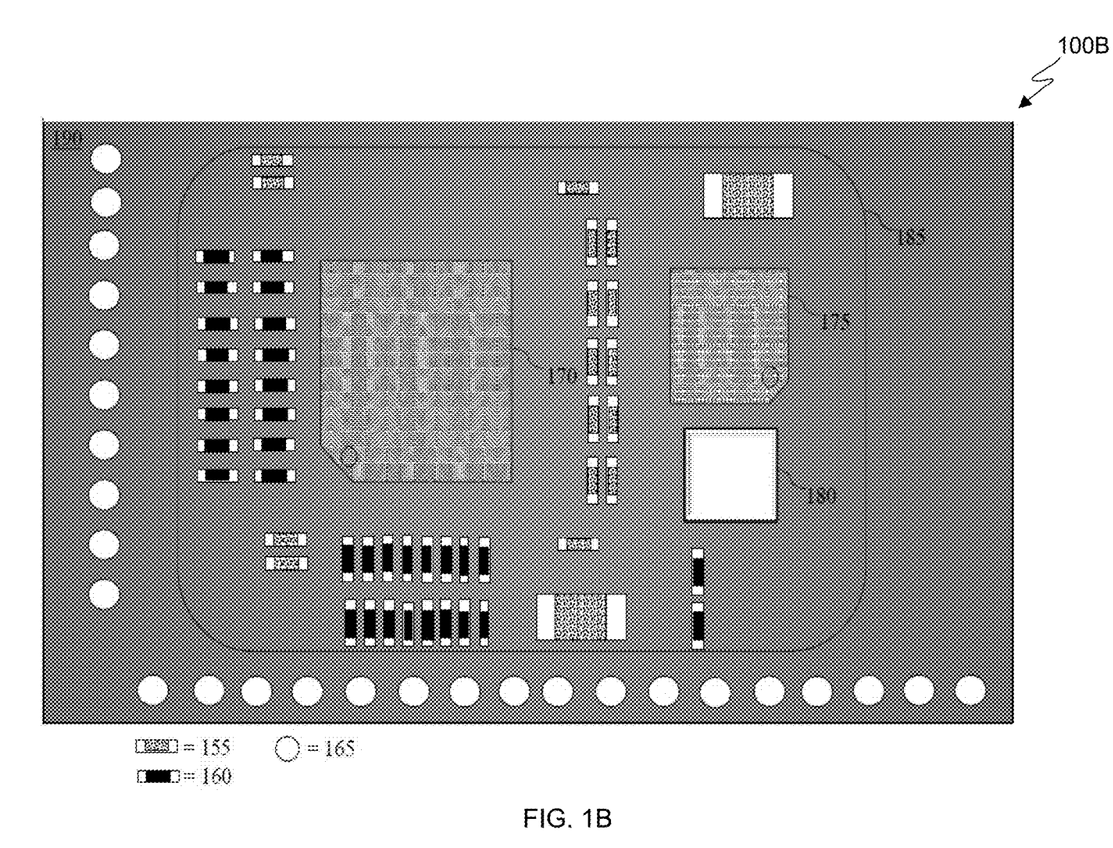
FIG. 1B is a diagram of a section of a PCBA, in accordance with an embodiment of the present invention.

FIG. 1B is a diagram of a section of a PCBA, in accordance with an embodiment of the present invention.

PCBA 100B is a section of a printed circuit board assembly which contains a non-functional pad to be exposed to accelerated stressing conditions which lead to the failure of components within cover 185. Printed circuit assemblies may prove to be very complex structures with many components, functional modules, and non-functional pads. The interplay of these components, functional modules, and non-functional pads may lead to variability in performance of PCBAs. Sections of PCBAs may meet quality assurance standards while other sections of PCBAs contain non-functional pads and/or components prone to defects, which may not meet quality assurance standards. Thus, the obtained quality assurance data for the complex PCBAs may prove to be non-representative and even misleading. In an exemplary embodiment, PCBA 100B contains non-functional pads exposed to accelerated stressing conditions in order to obtain a more representative result of a PCBA. Thus, insights into components prone to defects at a future point in time of the product's lifetime are obtained on the PCBA and the PCB associated with PCBA 100B.

Surface 190 is the plane/surface of the PCBA (e.g., PCBA 125) on which components have been soldered onto a non-functional pad region. For the purpose of clarity, pathways, pads, and other PCBA structures are not depicted on surface 190. When pathways and pads are depicted, the PCBA may resemble a structure as depicted in FIG. 1A. In an exemplary embodiment, cover 185 is a heat cover which serves as an apparatus similar or equivalent to stressor 120. Cover 185 retains heat in order to simulate temperature cycling. In this exemplary embodiment, the solder components are 34 units of resistor 160, 18 units of capacitor 155, 27 stitching fence units (e.g., via 145), quad flat no-leads (QFN) QFN 170, QFN 175, and inductor 180. Resistor 160 is a device which resists/impedes the passage of an electric current. Capacitor 155 is a device which stores electric charge. Inductor 180 is a device that stores electrical energy in a magnetic field when electric current is flowing through inductor 180.

QFN 170 and QFN 175 are quad-flat no-lead packages which physically and electrically connect integrated circuits to printed circuit boards (and printed circuit board assemblies). QFN 170 is a general type quad-flat no-lead package that modulates/controls signaling, clocking, and detection functions whereas QFN 175 controls the on/off functions of a quad-flat no-lead package that modulates/control voltage regulation. QFN 170 and QFN 175 are a surface-mount technology which connects integrated circuits to the surface 190 without having to use through-hole technology. Flat no-lead is a near chip scale (according to IPC™-Association Connecting Electronic Industries conventions) plastic encapsulated package made with a planar copper lead frame substrate. (Note: the term(s) "IPC" may be subject to trademark rights in various jurisdictions throughout the world and are used here only in reference to the products or services properly denominated by the marks to the extent that such trademark rights may exist.) As depicted in FIG. 1B, QFN 170 is physically larger in area as QFN 175. In other embodiments, QFN 175 is physically larger in area than QFN 170. QFN 170 and QFN 175 can be made to any specification for enabling/performing the disclosure, as recited in the claims. Furthermore, in other embodiments, there may be other components aside from QFN 170 and QFN 175 soldered onto surface 190, as contained within non-functional areas. These other components may be exposed to the applied stressor conditions and undergo destructive testing to fail. QFN 170 contains different perimeter lands and exposed thermal pads than QFN 175. These differences are described in more detail with respect to FIG. 2A and FIG. 2B, respectively. QFN 170 and QFN 175 may often experience CFE mismatches and experience solder joint cracks. The multiple units of resistor 160 and capacitor 155 and QFN 170 contain the circuitry for detecting the solder joints cracks. The call home feature (as described above with respect to application 113) and the controller feature (as described above with respect to stressor 120 and device 115) reside within QFN 170.

Figure 1C:
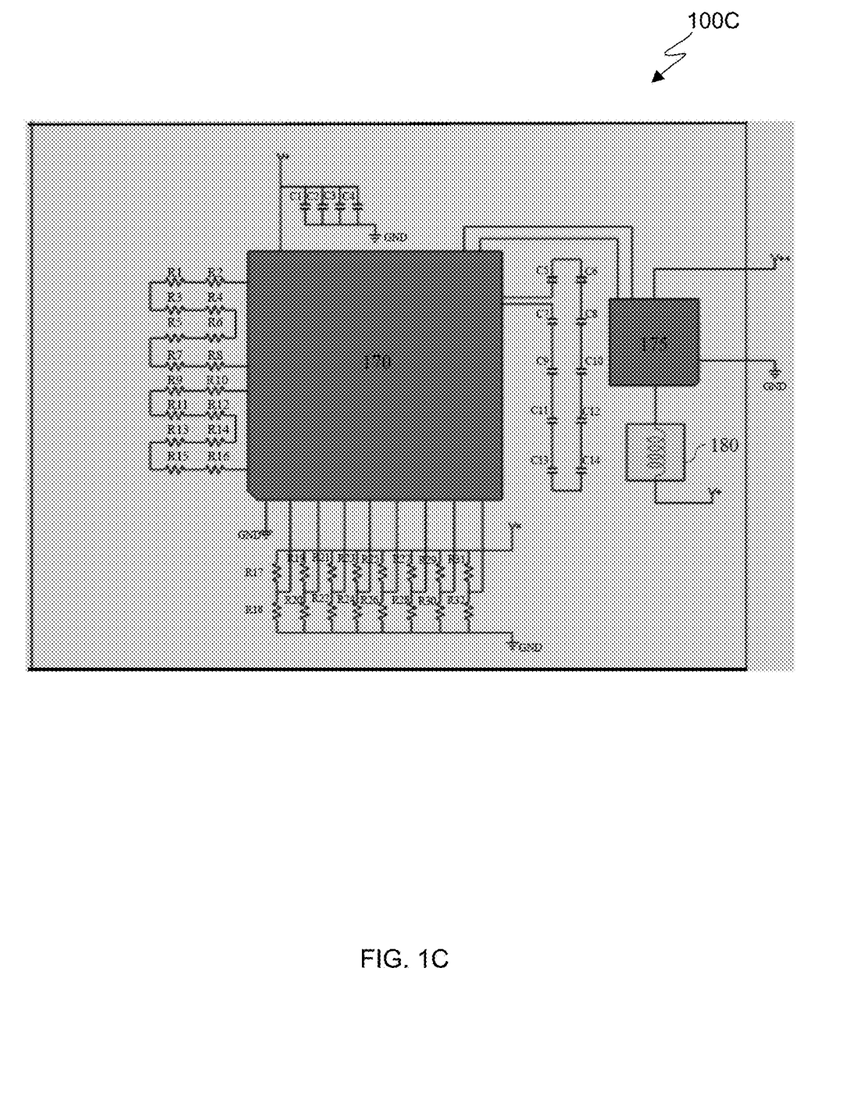
FIG. 1C is a circuit schematic diagram of a PCBA, in accordance with an embodiment of the present invention.

FIG. 1C is a circuit schematic diagram of a PCBA, in accordance with an embodiment of the present invention.

Schematic 100C is a circuit schematic consistent with the components which have been soldered onto surface 190 of FIG. 1B. R1 to R32 correspond with the multiple units of resistor 160; C1 to C14 correspond with the multiple units of capacitor 155; QFN 170 is connected to QFN 175; QFN 175 is connected to voltage source V++; inductor 180 is connected to QFN 175 and voltage source V+. The notation V+ implies a different voltage from V++. For example, inductor 180 connects to a different voltage source (i.e., V+) than QFN 175 (i.e., V++). Voltage source V+ is also connected to QFN 170 and R17 to R32. C1 to C4; QFN 170; R17 to R32; and QFN 175 are connected to a grounding device (GND).

Figure 2A:
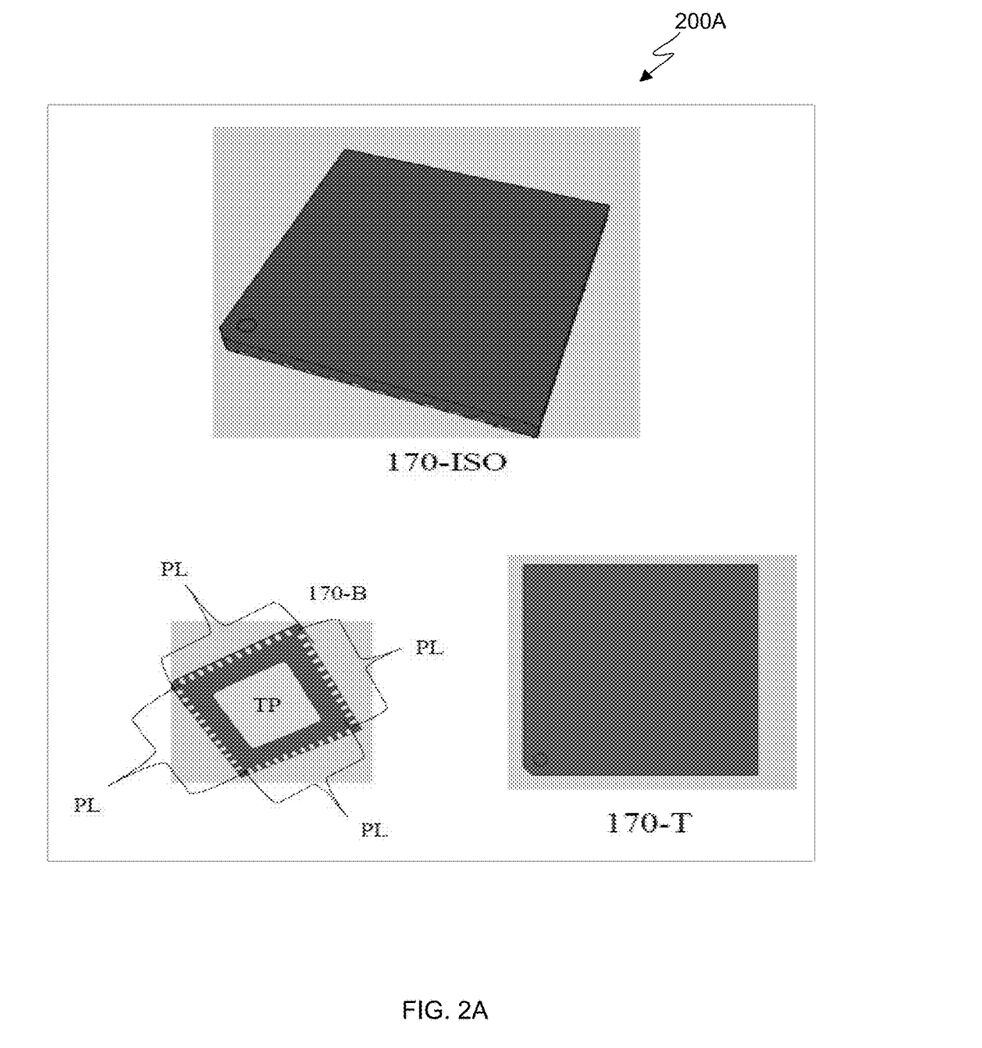
FIG. 2A is a screen shot of different views of a type of quad flat no-leads (QFN) package, in accordance with an embodiment of the present invention.

FIG. 2A is a screen shot of different views of a type of quad flat no-leads (QFN) package, in accordance with an embodiment of the present invention.

Screen shot 200A contains a bottom view of QFN 170, an isometric view of QFN 170, and a top view of QFN 170 depicted as 170-B, 170-ISO, 170-T, respectively. QFN 170 is a typically square shaped device. On the perimeter of 170-B, the perimeter lands are labelled with a "PL" and the single thermal pad is labelled with a "TP" as depicted in FIG. 2A. Perimeter lands on the bottom of QFN 170 provide electric connections to the printed circuit board. The thermal pad improves heat transfer out of the integrated circuit into the printed circuit board.

Figure 2B:
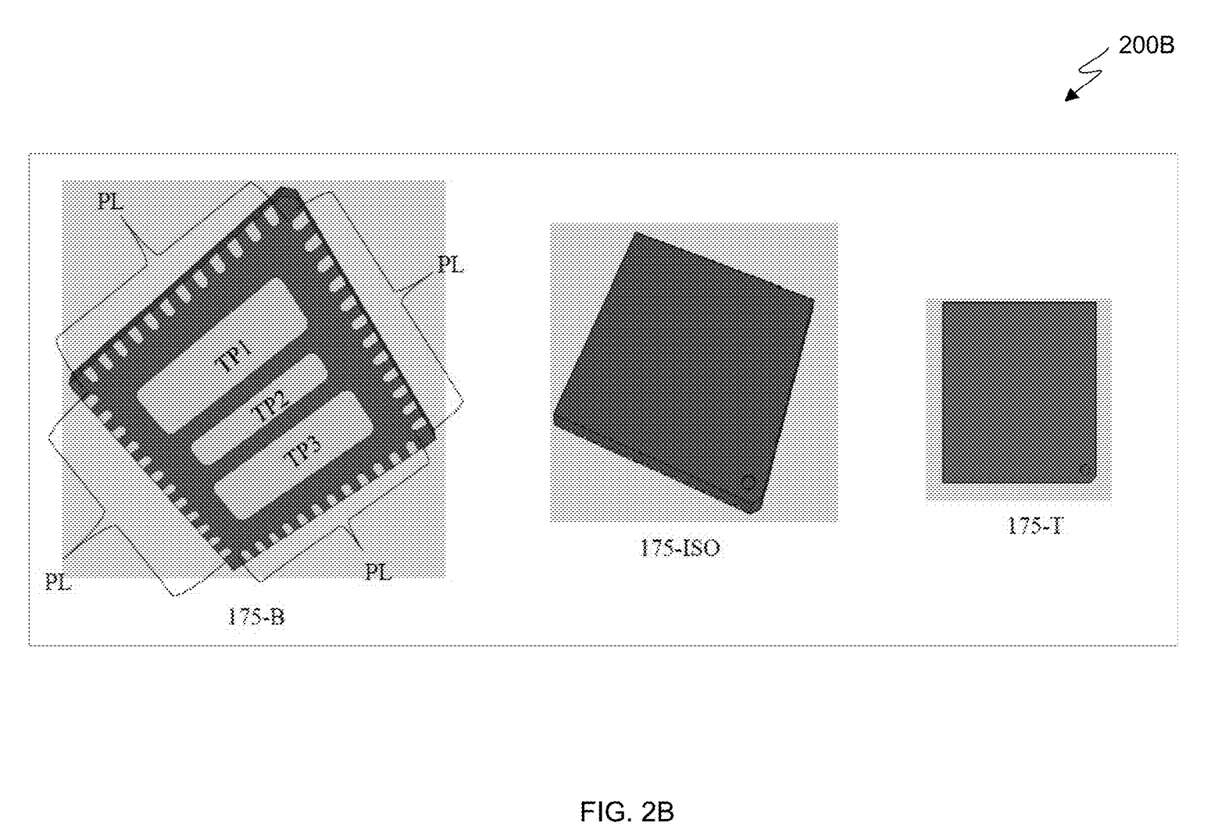
FIG. 2B is a screen shot of different views of another type quad flat no-leads (QFN) package, in accordance with an embodiment of the present invention.

FIG. 2B is a screen shot of different views of another type quad flat no-leads (QFN) package, in accordance with an embodiment of the present invention.

Screen shot 200B contains a bottom view of QFN 175, an isometric view of QFN 175, and a top view of QFN 175 depicted as 175-B, 175-ISO, 175-T, respectively. In this embodiment, QFN 175 is a typically square shaped device. However, in other embodiments, QFN 175 may be made to any optimal shape required. On the perimeter of 175-B, the perimeter lands are labelled with a "PL" and the three different types of thermal pads are each labelled as "TP1"; "TP2"; and "TP3", as depicted in FIG. 2B. PLs connect to the two wires which directly connect QFN 170 and QFN 175. TP1 connects to an outputting set of components (e.g., inductor 180 in FIG. 1C); TP2 connects to an inputting set of components (e.g., voltage source V++ in FIG. 1C); and TP3 connects to grounding set of components (e.g., grounding device GND in FIG. 1C). Perimeter lands on the bottom of QFN 175 provide electric connections to the printed circuit board. The thermal pad improves heat transfer out of the integrated circuit into the printed circuit board.

Figure 3:
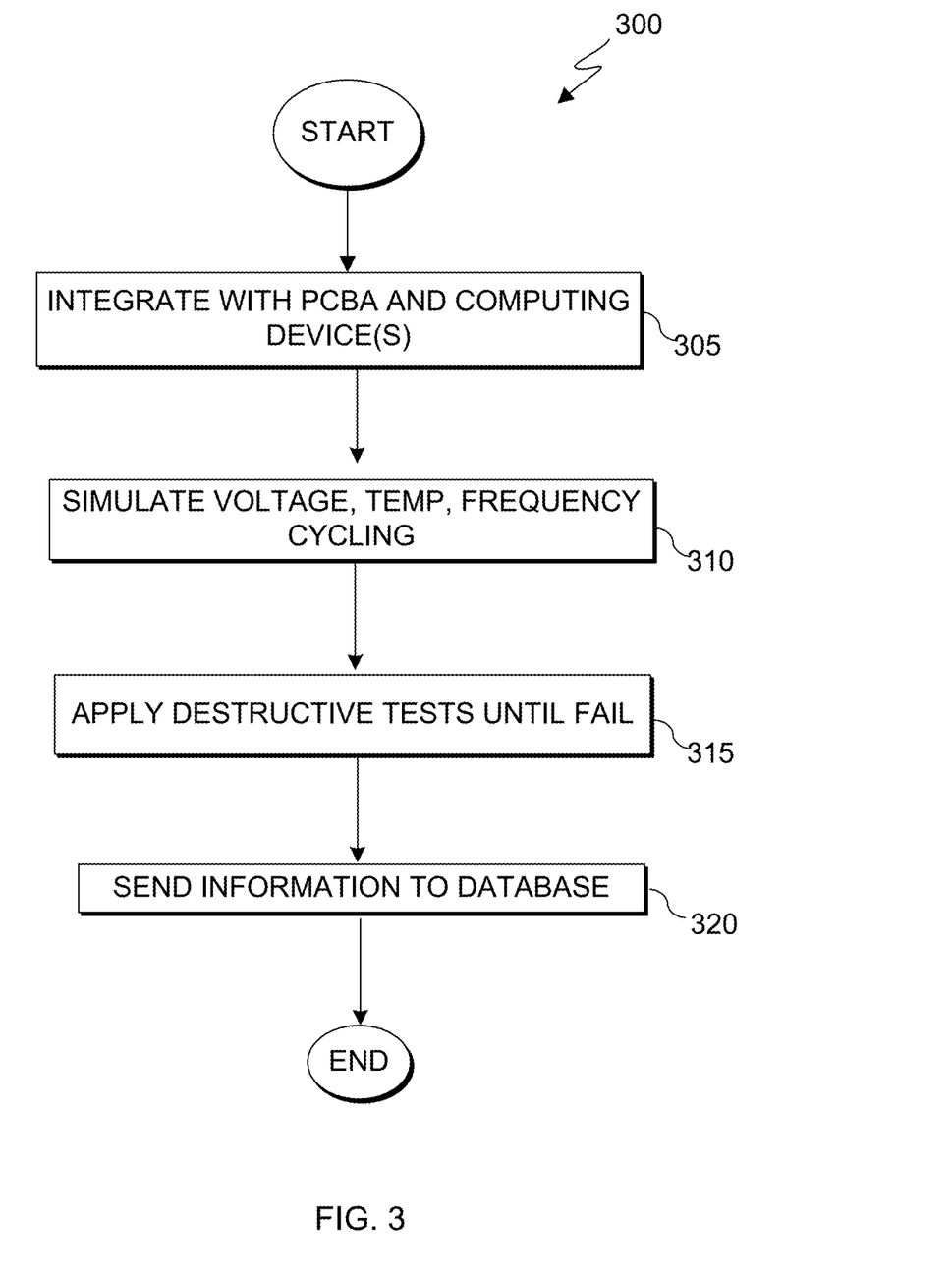
FIG. 3 is a flowchart depicting the steps to test a PCBA, in accordance with an embodiment of the present invention.

FIG. 3 is a flowchart depicting the steps to test a PCBA, in accordance with an embodiment of the present invention.

Flowchart 300 depicts the steps performed by application 113 (e.g., steps 305, 310, 315, and 320).

In step 305, application 113 integrates a PCBA and computing device(s). In an exemplary embodiment, application 113 integrates a PCBA and computing devices (e.g., computer 110) by physically attaching an apparatus such as stressor 120 to the surface of a PCBA (e.g., surface 140A of PCBA 125). Stressor 120 is operatively connected to computer 110 and device 115. Device 115 is described above in further detail with respect to FIG. 1A. Application 113 resides within a computing device, such as computer 110. In various embodiments, Application 113 contains a graphical user interface and a database/or access to a database associated with a different computer program In an exemplary embodiment, application 113 integrates a PCBA and computing devices (e.g., computer 110) by controlling the functioning of device 115 and stressor 120 while detecting changes/modifications of a component contained within stressor 120. As mentioned above, stressor 120 is physically attached to or physically placed over a non-functional area of surface of the PCBA, wherein the non-functional area contains a component susceptible to defects. Thus, the component susceptible to defects is: (i) contained within stressor 120; and (ii) capable of communicating with application 113. By virtue of being capable of communicating with application 113, detected modifications to the component susceptible to defects are obtained by application 113. In an exemplary embodiment, a database in computer 110 stores any obtained information/data from destructive tests. This information/data can then be analyzed and further manipulated by an end-user in order to understand trends during destructive testing to fail.

In step 310, application 113 simulates voltage, temperature, and frequency cycling. In this embodiment, application 113 simulates voltage, temperature, and frequency cycling by transmitting a set of instructions to stressor 120 to simulate voltage, temperature, and frequency cycling. In this embodiment, application 113 transmits instructions to stressor 120 according to a user request. In other embodiments, application 113 transmits instructions to stressor 120 to simulate voltage, temperature, and frequency cycling according to a pre-defined schedule.

In an exemplary embodiment, stressor 120 is designed to act upon a non-functional area which contains an embedded component of interest as opposed to a functional module which contains the embedded component of interest. In an exemplary embodiment, the component of interest is susceptible (i.e., a suspect component) to solder cracking as in the case of QFN 170. Simulating voltage, temperature, and frequency accelerates the destructive testing conditions within the non-functional area corresponding with stressor 120. Simulating voltage, temperature, and frequency cycling on a non-functional area using stressor 120 leads to measurements that more representative of the entire PCBA. A more representative measurement is in turn a more accurate measure by taking into account suspect components and non-suspect components and different types of area of the PCBA.

Destructive testing of functional modules as opposed to destructive testing of non-functional areas of PCBAs tend to have significant costs. Destructive testing to fail of functional modules may involve the following scenarios: (i) sampling at the start of production of PCBAs which does not capture drifts in process parameters; (ii) cross section analysis of a high performing section/part of the PCBA which does not capture variability within the high performing section/part deemed to pass a quality assurance test (e.g., a high CTE known to cause separations across a range of connections is overlooked within the section that passes a quality assurance test); (iii) electrical testing of the PCBA which may overlook electric connections of separations operatively connected to each other without accounting for suspect components; and (iv) utilizing digital imaging correlation to evaluate CTE of PCBs corresponding to the respective PCBAs by measuring in-plane and out-of-plane displacements of an object surface. Thus, obtaining data on non-representative samples of a PCB or a PCBA, scenarios (i), (ii), (iii), and (iv) are not as conducive for making accurate measurements with respect to component, sub-components, etc. of a PCBA susceptible to: (a) poor performance; and/or (b) undesired properties (e.g., a tendency of solder joint cracking of QFN 170 upon exposure to temperature fluctuations).

In step 315, application 113 applies destructive tests until fail. In this embodiment, application applies destructive tests until fail by transmitting a set of instructions to stressor 120 to apply destructive tests until fail. In this embodiment, stressor 120 may be connected to device 115. In this instance, device 115 is able to control the conditions which stressor 120 applies onto soldered components on a non-functional area of a surface of the PCBA. An example of a "destructive test until fail" are "destructive cycling tests." In destructive cycling tests, the soldered component on a non-functional area of a surface of the PCBA is exposed to accelerated stressor conditions to the point of soldered component failure.

In an exemplary embodiment, stressor 120 and device 115 are connected to each other to control by varying the amount of heat applied to the non-functional area. Over a period of time, there is an initial large increase in temperature followed by an even larger increase in temperature, and a concluding small increase in temperature causing a soldered component within the non-functional area to fail (e.g., cracking a solder joint of QFN 170). As stated above, this is an example of accelerated testing conditions. Other types of destructive tests that may be applied include: (i) higher than typical heat exposure to non-functional areas of the PCBA in a controlled fashion; (ii) higher than typical strain exposure to non-functional areas of the PCBA in a controlled fashion; (iii) higher than typical humidity exposure to non-functional areas of the PCBA in a controlled fashion; and (iv) higher than typical flux to non-functional areas of the PCBA in a controlled fashion. The "typical" heat, strain, humidity, and flux exposures are conditions that are most frequently used by a tester in the field. The PCBA structures amenable to this type of destructive testing include: (i) high CTE components susceptible to solder cracks; (ii) thermally sensitive components susceptible to structural defects due to heat; and (iii) vias, traces, pads and other PCB structures susceptible to defects due to heat, strain, flux, etc. The application of this type of destructive test to fail on each PCB (or PCBA) during production on a non-functional area occurs in an accelerated manner. Certain areas have thus, experienced accelerated destruction to fail beyond the typically analyzed functional module areas. The functional area meeting quality assurance standards may mask/hide that there are potentially defective components in a non-functional area. In various embodiments, the accelerated destructive testing until fail within the non-functional area does not interfere with the functional areas and only modifies components within the non-functional area. Subsequently, application 113 is able to compare the area exposed to accelerated destruction to the area not exposed to accelerated destruction by outputting a generated interactive graph displayed in the graphic user interface of application 113. This comparison is then a way of: (i) providing future insights into potential failures; and (ii) replicating the structure of the functional board. For example, a solder joint of QFN 170 rapidly disintegrates upon extreme voltage fluctuations in the non-functional area as opposed to QFN 170 remaining intact upon extreme voltage in the functional area. This is indicative of QFN 170 of being a potential source of product failures despite the functional area meeting quality assurance standards.

In various embodiments, the generated interactive graph display in the graphical user interface of application 113 shows/outputs data obtained by stressing a non-functional area. The obtained data can be further refined as a function of analysis, as performed by application 113. Furthermore, there may be a voluminous amount of obtained data upon stressing the non-functional area. In such instances, the obtained data needs to be further refined or analyzed in order to: (i) ascertain trends or (ii) output visualizations which associate a variable (e.g., temperature) with a suspect component prone to defects under accelerated destructive testing conditions to fail. For example, the obtained data may be temperature and viscosity measurements as a function of time. Application 113 has selectable "buttons" in the graphical user interface of application 113 for performing further analysis. There is one button for fitting the data to the Coffin-Manson equation (which incorporates temperature as a parameter to calculate acceleration factors) and another button for fitting the data to the Mark-Houwink-Sakurda equation (which incorporates viscosity as a parameter to calculate molecular weight distribution of polymers). In response to selecting the buttons for the Coffin-Manson equation and the Mark-Houwink-Sakurda equation, trends may be spotted which correspond to the failure of a component prone to defects contained within the non-functional area of the PCBA under accelerated stressor conditions. In this example, the obtained data fits the Coffin-Manson equation but does not fit the Mark-Houwink-Sakurda equation. This is indicative of: (i) temperature, as obtained by measurements from the accelerated destructive testing to fail, effects the failure of the suspect component suspect component; and (ii) viscosity, as obtained by measurements from the accelerated destructive testing to fail, does not effect the failure of the suspect component. Thus, analysis by further refining obtained data, as performed by application 113, aids in examining/testing the effect of a variable (e.g., temperature or viscosity) on the failure of a unit of component 105 soldered in the non-functional area of PCBA 125. More specifically, application 113 may determine: (i) which components within a non-functional area are prone to defects; and (ii) whether a variable of interest may or may not have an effect on the suspect component to failure. In other embodiments, visualizations from the obtained data in response to applying accelerated stressor conditions may be used for in-situ and real-time monitoring of the non-functional area and suspect components in the non-functional area. New tests or quality assurance measures, in addition to known or established tests, may be devised which quantify and qualify events that correlate with the suspect component in the non-functional area, in response to accelerated destructive testing to fail.

In step 320, application 113 sends information to a database. In this embodiment, application 113 sends the information gathered from the applied destructive tests to a database via network 114, wherein the database resides in computer 110. In other embodiments, application 113 can send the information gathered from the applied destructive tests to one or more other components of data processing environment 100A. In an exemplary embodiment, from the obtained/gathered information, application 113 can further manipulate the obtained/gathered information in order to find variables that contribute to the failure and/or defects of components contained within stressor 120, wherein stressor 120 communicates with application 113.

In this embodiment, the information/data sent to the database has been obtained from steps 310 and 315. In an exemplary embodiment, the information/data obtained can include temperatures that are monitored during cycling and the application of the destructive cycling tests until fail. These temperatures are recorded/obtained by application 113 and sent to a database. This temperature data is further analyzed and refined by application 113. For example, refining temperature data involves computing temperature differences in order to calculate the acceleration factor of the Coffin-Manson equation.

The obtained information/data may also be used to correlate degradation events during the destructive testing to fail within a non-functional area. For example, major temperature increases for a prolonged period of time lead to simultaneous solder joint cracking of QFN 170 and soldered units of resistor 160 cracking. In the instance of a major temperature increase, the solder joint cracking of QFN 170 and the cracking of soldered units of resistor 160 are the only events corresponding with components that experience destruction to fail. In contrast, minor temperature increases for a prolonged period of time lead to initial cracking of soldered units of resistor 160 followed by solder joint cracking of QFN 170. In the instance of a minor temperature increase, the solder joint cracking of QFN 170 and the cracking of soldered units of resistor 160 are the only events corresponding with components that experience destruction to fail. These results are indicative of: (i) QFN 170 of a PCBA being more sensitive to temperature increases than resistor 160; and (ii) the amount of temperature increase (major increase as opposed to minor increase) influences how/when the components fail (simultaneous failure as opposed to non-simultaneous failure).

Figure 4:
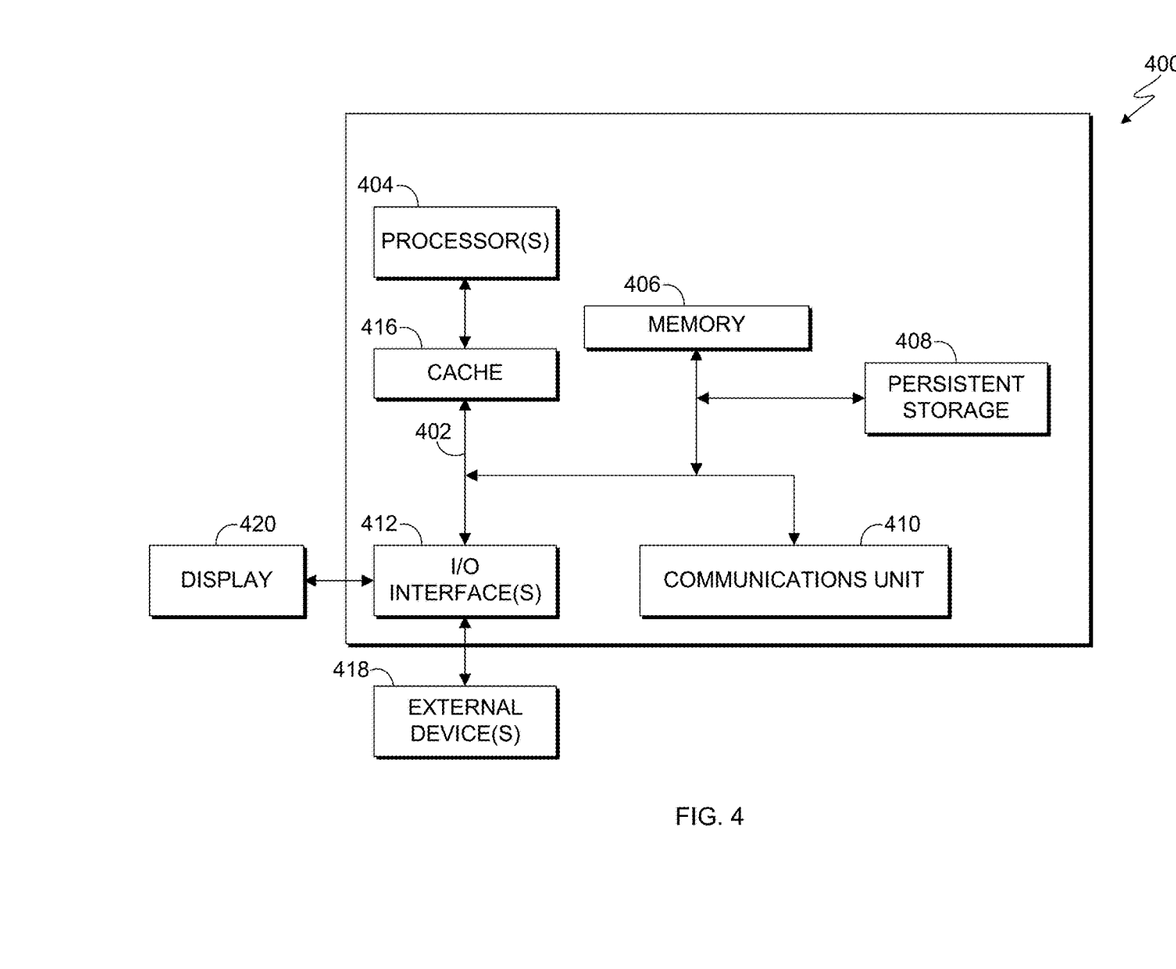
FIG. 4 depicts a block diagram of internal and external components of a computing device, in accordance with an embodiment of the present invention.

FIG. 4 depicts a block diagram of components of a computing device, generally designated 400, in accordance with an illustrative embodiment of the present invention. It should be appreciated that FIG. 4 provides only an illustration of one implementation and does not imply any limitations with regard to the environments in which different embodiments may be implemented. Many modifications to the depicted environment may be made.

Computing device 400 includes communications fabric 402, which provides communications between computer processor(s) 404, memory 406, persistent storage 408, communications unit 410, and input/output (I/O) interface(s) 412. Communications fabric 402 can be implemented with any architecture designed for passing data and/or control information between processors (such as microprocessors, communications and network processors, etc.), system memory, peripheral devices, and any other hardware components within a system. For example, communications fabric 402 can be implemented with one or more buses.

Memory 406 and persistent storage 408 are computer readable storage media. In this embodiment, memory 406 includes random access memory (RAM) 414 and cache memory 416. In general, memory 406 can include any suitable volatile or non-volatile computer readable storage media.

Program instructions and data used to practice embodiments of the present invention may be stored in persistent storage 408 for execution and/or access by one or more of the respective computer processors 404 via one or more memories of memory 406. In this embodiment, persistent storage 408 includes a magnetic hard disk drive. Alternatively, or in addition to a magnetic hard disk drive, persistent storage 408 can include a solid state hard drive, a semiconductor storage device, read-only memory (ROM), erasable programmable read-only memory (EPROM), flash memory, or any other computer readable storage media that is capable of storing program instructions or digital information.

The media used by persistent storage 408 may also be removable. For example, a removable hard drive may be used for persistent storage 408. Other examples include optical and magnetic disks, thumb drives, and smart cards that are inserted into a drive for transfer onto another computer readable storage medium that is also part of persistent storage 408.

Communications unit 410, in these examples, provides for communications with other data processing systems or devices. In these examples, communications unit 410 includes one or more network interface cards. Communications unit 410 may provide communications through the use of either or both physical and wireless communications links. Program instructions and data used to practice embodiments of the present invention may be downloaded to persistent storage 408 through communications unit 410.

I/O interface(s) 412 allows for input and output of data with other devices that may be connected to computing device 400. For example, I/O interface 412 may provide a connection to external devices 418 such as a keyboard, keypad, a touch screen, and/or some other suitable input device. External devices 418 can also include portable computer readable storage media such as, for example, thumb drives, portable optical or magnetic disks, and memory cards. Software and data used to practice embodiments of the present invention, e.g., software and data, can be stored on such portable computer readable storage media and can be loaded onto persistent storage 408 via I/O interface(s) 412. I/O interface(s) 412 also connect to a display 420.

Display 420 provides a mechanism to display data to a user and may be, for example, a computer monitor.

The programs described herein are identified based upon the application for which they are implemented in a specific embodiment of the invention. However, it should be appreciated that any particular program nomenclature herein is used merely for convenience and thus, the invention should not be limited to use solely in any specific application identified and/or implied by such nomenclature.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A method comprising:
   integrating a printed circuit board assembly (PCBA) and a computing device, wherein the PCBA contains: a plurality of functional areas and a plurality of non-functional areas on a printed circuit board (PCB), wherein the plurality of functional areas and the plurality of non-functional areas on the PCB consist of high coefficient of thermal expansion components susceptible to solder cracks and thermally sensitive components susceptible to thermal defects;
   stressing a non-functional area of the plurality of non-functional areas of the PCBA that is susceptible to defects using destructive cycling tests, wherein the plurality of non-functional areas contains an embedded component susceptible to defects;
   placing an apparatus that simulates voltage, temperature, and cycle testing as the destructive cycling on a surface of the PCBA containing at least the plurality of non-functional areas;
   connecting the apparatus of the PCBA to a controller device, wherein the controller device aids the apparatus in simulating the voltage, temperature, and cycle testing;
   applying destructive testing to failure of the embedded component susceptible to defect by:
     exposing the non-functional area to heat,
     exposing the non-functional area to strain,
     exposing the non-functional area to humidity, and
     exposing the non-functional area to flux;
   monitoring degradation of the embedded component susceptible to defects in real-time in response to applying to applying destructive testing to failure of the embedded component susceptible to the defect;
   deriving information from the applied destructive testing by detecting effects of the heat, the strain, the humidity, and the flux on the non-functional area,
   responsive to deriving information from the applied destructive testing, sending the derived information to a repository within the computing device; and
   responsive to deriving information from the applied destructive testing, outputting the derived information to a user interface within the computing device.

* * * * *